(12) United States Patent
Kyono et al.

(10) Patent No.: US 9,281,427 B2
(45) Date of Patent: Mar. 8, 2016

(54) SEMICONDUCTOR DEVICE

(71) Applicant: SUMITOMO ELECTRIC INDUSTRIES, LTD., Osaka-shi, Osaka (JP)

(72) Inventors: Takashi Kyono, Itami (JP); Suguru Arikata, Itami (JP); Katsushi Akita, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/745,681

(22) Filed: Jun. 22, 2015

(65) Prior Publication Data

US 2015/0372174 A1 Dec. 24, 2015

(30) Foreign Application Priority Data

Jun. 23, 2014 (JP) ................................ 2014-128287

(51) Int. Cl.
| | |
|---|---|
| *H01L 31/00* | (2006.01) |
| *H01L 31/0352* | (2006.01) |
| *H01L 31/0304* | (2006.01) |
| *H01L 31/109* | (2006.01) |

(52) U.S. Cl.
CPC .. *H01L 31/035236* (2013.01); *H01L 31/03046* (2013.01); *H01L 31/109* (2013.01)

(58) Field of Classification Search
CPC .......................... H01L 29/155; H01L 31/0352
See application file for complete search history.

(56) References Cited

U.S. PATENT DOCUMENTS 5,536,948 A * 7/1996 Lee .................. B82Y 20/00
257/17

OTHER PUBLICATIONS

Yong Huang et al., "InAs/GaSb type-II superlattice structures and photodiodes grown by metalorganic chemical vapor deposition," Applied Physics Letters, 2010, pp. 251107-1-251107-3, vol. 96.

X.B. Zhang et al., "Improved surface and structural properties of InAs/GaSb superlattices on (001) GaSb substrate by introducing an InAsSb layer at interfaces," Applied Physics Letters, 2007, pp. 131110-1-131110-3, vol. 90.

* cited by examiner

*Primary Examiner* — Matthew Reames
(74) *Attorney, Agent, or Firm* — Drinker Biddle & Reath LLP

(57) ABSTRACT

An infrared photodiode that is a semiconductor device includes a substrate, a buffer layer formed of GaSb, and an absorption layer including a multiple quantum well structure. The multiple quantum well structure includes a stack of unit structures each including a plurality of component layers. Each unit structure includes a first component layer formed of $InAs_{1-a}Sb_a$ where the ratio a is 0 or more and 0.05 or less, a second component layer formed of GaSb, and a third component layer formed of $InSb_xAs_{1-x}$ where the ratio x is more than 0 and less than 1. The third component layer is disposed so as to be in contact with one main surface of the second component layer. The other main surface of the second component layer is in contact with the first component layer within the unit structure. The third component layer has a thickness of 0.1 nm or more and 0.9 nm or less.

13 Claims, 12 Drawing Sheets

SEMICONDUCTOR DEVICE

BACKGROUND OF THE INVENTION

1. Field of the Invention

The present invention relates to a semiconductor device, more specifically, to a semiconductor device including an absorption layer including a multiple quantum well structure.

2. Description of the Related Art

In general, a semiconductor device serving as a photodiode can be produced by forming an absorption layer including a multiple quantum well structure formed of III-V compound semiconductors on a buffer layer formed of GaSb (gallium antimonide). In a case where the multiple quantum well structure is formed so as to include a stack of unit structures each including an InAs (indium arsenide) layer and a GaSb layer, the semiconductor device can be produced as a photodiode for mid-infrared light.

In this case of forming, on the buffer layer, an absorption layer including a multiple quantum well structure including a stack of the unit structures, a difference in lattice constant between GaSb and InAs causes tensile strain to be applied to the InAs layers within unit structures. In a multiple quantum well structure having a stack of a large number of the unit structures, the presence of tensile strain may cause lattice relaxation therein.

One measure having been suggested for avoiding the occurrence of lattice relaxation is to form, within unit structures, strain compensation layers to which compressive strain is applied (for example, refer to Huang et al., "InAs/GaSb type-II superlattice structures and photodiodes grown by metalorganic chemical vapor deposition", APPLIED PHYSICS LETTERS 96 251107, 2010; and Zhang et al., "Improved surface and structural properties of InAs/GaSb superlattices on (001) GaSb substrate by introducing an InAsSb layer at interfaces", APPLIED PHYSICS LETTERS 90 131110, 2007).

SUMMARY OF THE INVENTION

In recent years, there has sometimes been a demand for an increase in the number of unit structures stacked in the multiple quantum well structure for the purpose of enhancing the sensitivity of photodiodes, for example. In such a case, strain compensation layers to which high compressive strain is applied can be formed to thereby suppress the occurrence of lattice relaxation. In order to form such strain compensation layers to which high compressive strain is applied, the layers need to be formed of crystals having a lattice constant considerably different from that of GaSb. In this case, the presence of the large difference in lattice constant makes it difficult to form the strain compensation layers while maintaining good surface morphology (planarity, regularity of atomic steps, and low density of pit-like defects). In other words, it is not easy to form an absorption layer including strain compensation layers that can sufficiently suppress occurrence of lattice relaxation while maintaining good surface morphology.

Accordingly, an object is to provide a semiconductor device including an absorption layer including strain compensation layers that can sufficiently suppress occurrence of lattice relaxation while maintaining good surface morphology.

A semiconductor device according to an aspect of the present invention includes a substrate formed of a III-V compound semiconductor; a buffer layer disposed on the substrate and formed of GaSb; and an absorption layer formed on the buffer layer and including a multiple quantum well structure formed of III-V compound semiconductors. The multiple quantum well structure includes a stack of unit structures each including a plurality of component layers. Each of the unit structures includes a first component layer formed of $InAs_{1-a}Sb_a$, a second component layer formed of GaSb, and a third component layer formed of $InSb_xAs_{1-x}$. In one unit structure among the unit structures, the third component layer is disposed so as to be in contact with one of main surfaces of the second component layer. The other one of the main surfaces of the second component layer is in contact with the first component layer present within the one unit structure or within another unit structure disposed on the one unit structure. In $InAs_{1-a}Sb_a$ forming the first component layer, the ratio a is 0 or more and 0.05 or less. In $InSb_xAs_{1-x}$ forming the third component layer, the ratio x is more than 0 and less than 1. The third component layer has a thickness of 0.1 nm or more and 0.9 nm or less.

A semiconductor device according to another aspect of the present invention includes a substrate formed of a III-V compound semiconductor; a buffer layer disposed on the substrate and formed of GaSb; and an absorption layer formed on the buffer layer and including a multiple quantum well structure formed of III-V compound semiconductors. The multiple quantum well structure includes a stack of unit structures each including a plurality of component layers. Each of the unit structures includes a first component layer formed of $InAs_{1-a}Sb_a$, a second component layer formed of GaSb, a third component layer formed of $InSb_xAs_{1-x}$, and a fourth component layer formed of $InSb_yAs_{1-y}$. In the unit structure, the third component layer is disposed so as to be in contact with one of main surfaces of the second component layer, and the fourth component layer is disposed so as to be in contact with the other one of the main surfaces of the second component layer. In $InAs_{1-a}Sb_a$ forming the first component layer, the ratio a is 0 or more and 0.05 or less. In $InSb_yAs_{1-x}$ forming the third component layer, the ratio x is more than 0 and less than 1. In $InSb_yAs_{1-y}$ forming the fourth component layer, the ratio y is 0.3 or more and less than 1. The third component layer has a thickness of 0.1 nm or more and 0.9 nm or less. The fourth component layer has a thickness of 0.1 nm or more and 0.9 nm or less.

DESCRIPTION OF THE PREFERRED EMBODIMENTS

Figure 1:
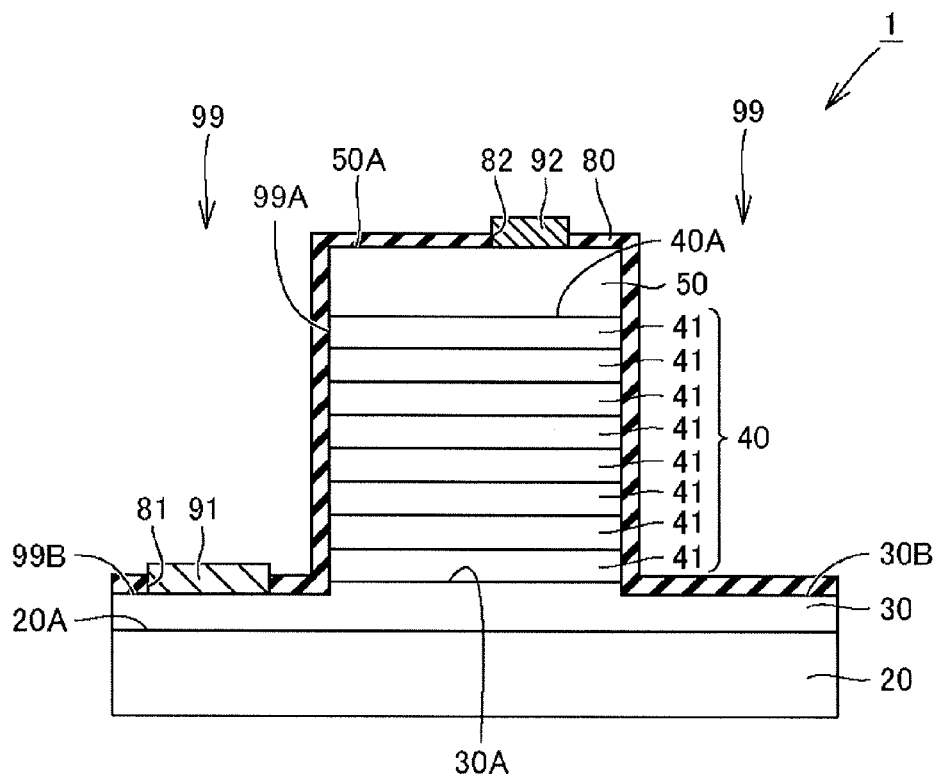
FIG. 1 is a schematic sectional view illustrating an example of the configuration of a photodiode.

Hereinafter, embodiments according to the present invention will be first listed and described. A semiconductor device according to an aspect of the present invention includes a substrate formed of a III-V compound semiconductor; a buffer layer disposed on the substrate and formed of GaSb; and an absorption layer formed on the buffer layer and including a multiple quantum well structure formed of III-V compound semiconductors. The multiple quantum well structure includes a stack of unit structures each including a plurality of component layers. Each of the unit structures includes a first component layer formed of $InAs_{1-a}Sb_a$, a second component layer formed of GaSb, and a third component layer formed of $InSb_xAs_{1-x}$. In one unit structure among the unit structures, the third component layer is disposed so as to be in contact with one of main surfaces of the second component layer. The other one of the main surfaces of the second component layer is in contact with the first component layer present within the one unit structure or within another unit structure disposed on the one unit structure. In $InAs_{1-a}Sb_a$ forming the first component layer, the ratio a is 0 or more and 0.05 or less. In $InSb_xAs_{1-x}$ forming the third component layer, the ratio x is more than 0 and less than 1. The third component layer has a thickness of 0.1 nm or more and 0.9 nm or less.

A semiconductor device according to another aspect of the present invention includes a substrate formed of a III-V compound semiconductor; a buffer layer disposed on the substrate and formed of GaSb; and an absorption layer formed on the buffer layer and including a multiple quantum well structure formed of III-V compound semiconductors. The multiple quantum well structure includes a stack of unit structures each including a plurality of component layers. Each of the unit structures includes a first component layer formed of $InAs_{1-a}Sb_a$, a second component layer formed of GaSb, a third component layer formed of $InSb_xAs_{1-x}$, and a fourth component layer formed of $InSb_yAs_{1-y}$. In the unit structure, the third component layer is disposed so as to be in contact with one of main surfaces of the second component layer, and the fourth component layer is disposed so as to be in contact with the other one of the main surfaces of the second component layer. In $InAs_{1-a}Sb_a$ forming the first component layer, the ratio a is 0 or more and 0.05 or less. In $InSb_xAs_{1-x}$ forming the third component layer, the ratio x is more than 0 and less than 1. In $InSb_yAs_{1-y}$ forming the fourth component layer, the ratio y is 0.3 or more and less than 1. The third component layer has a thickness of 0.1 nm or more and 0.9 nm or less. The fourth component layer has a thickness of 0.1 nm or more and 0.9 nm or less.

In the above-described semiconductor devices, the ratio x in $InSb_xAs_{1-x}$ forming the third component layer is preferably 0.3 or more.

The inventors of the present invention performed studies on how to form a strain compensation layer that can sufficiently suppress occurrence of lattice relaxation while maintaining good surface morphology. In a multiple quantum well structure including a stack of unit structures each including a first component layer formed of $InAs_{1-a}Sb_a$ (where the ratio a is 0 or more and 0.05 or less) and a second component layer formed of GaSb, from the standpoint of sufficient suppression of occurrence of lattice relaxation, employment of strain compensation layers (third component layer and fourth component layer) formed of InSb is conceived, for example. InSb has a lattice constant that is considerably different from that of GaSb. Accordingly, high compressive strain is applied to the InSb layers and hence these layers sufficiently function as strain compensation layers. However, formation of the strain compensation layers formed of InSb in a unit structure including the first component layer and the second component layer makes it difficult to maintain good surface morphology. Regarding such a problem, the inventors of the present invention have found that, by doping InSb with As, the strain compensation layers are easily formed while maintaining good surface morphology. A possible reason why introduction of As results in improvement in surface morphology is as follows, for example.

During growth of InSb crystals, Sb tends to segregate in the surface region. For this reason, in order to grow an InSb layer while maintaining good surface morphology, the supply ratio of In to Sb needs to be strictly controlled. This control of crystal growth is difficult to achieve so that good surface morphology is difficult to maintain. During crystal growth, As is easily incorporated into crystals. Introduction of As during InSb crystal growth probably reduces segregation of Sb and also the resultant difficulty in control of crystal growth, resulting in improvement in surface morphology.

A semiconductor device according to an embodiment of the present invention includes a multiple quantum well structure including a stack of unit structures each including a first component layer formed of $InAs_{1-a}Sb_a$ (where the ratio a is 0 or more and 0.05 or less) and a second component layer formed of GaSb; and each unit structure further includes a strain compensation layer formed of InSbAs. As a result, the strain compensation layer that can sufficiently suppress occurrence of lattice relaxation can be introduced into the multiple quantum well structure while maintaining good surface morphology. The strain compensation layer (third component layer) may be disposed so as to be in contact with only one of the main surfaces of the second component layer. In this case, occurrence of lattice relaxation can be suppressed without making production processes considerably complicated. Alternatively, strain compensation layers (third component layer and fourth component layer) may be respectively disposed so as to be in contact with one main surface and the other main surface of the second component layer. In this case, occurrence of lattice relaxation can be more strongly suppressed without considerably increasing the thickness of the strain compensation layers.

In a case where strain compensation layers (third component layer and fourth component layer) are respectively disposed so as to be in contact with one main surface and the other main surface of the second component layer, the ratio y in $InSb_yAs_{1-y}$ forming the fourth component layer is 0.3 or more and less than 1. By setting the ratio y, which is the ratio of Sb to the group V elements forming the strain compensation layer, to 0.3 or more, occurrence of lattice relaxation can be strongly suppressed. In $InSb_xAs_{1-x}$ forming the third component layer, the ratio x is more than 0 and less than 1. By setting the ratio x to 0.3 or more, occurrence of lattice relaxation can be more strongly suppressed.

In a case where the third component layer and the fourth component layer serving as strain compensation layers each have a thickness of less than 0.1 nm, the effect of suppressing occurrence of lattice relaxation is not sufficiently provided. In another case where the third component layer and the fourth component layer each have a thickness of more than 0.9 nm, it becomes difficult to maintain good surface morphology. For these reasons, a semiconductor device according to an embodiment of the present invention includes the third component layer and the fourth component layer that each have a thickness of 0.1 nm or more and 0.9 nm or less. The third component layer and the fourth component layer preferably each have a thickness of 0.2 nm or more in order to suppress occurrence of lattice relaxation with more certainty. The third component layer and the fourth component layer preferably each have a thickness of 0.7 nm or less in order to achieve good surface morphology with more certainty.

In summary, the present invention can provide semiconductor devices including an absorption layer including a strain compensation layer that can sufficiently suppress occurrence of lattice relaxation while maintaining good surface morphology.

In the above-described semiconductor devices, each of the unit structures may further include a fifth component layer formed of $InSb_zAs_{1-z}$. This fifth component layer may be disposed within the first component layer or within the second component layer. In $InSb_zAs_{1-z}$ forming the fifth component layer, the ratio z may be more than 0 and less than 1. The fifth component layer may have a thickness of 0.1 nm or more and 0.9 nm or less.

In this way, by forming the fifth component layer serving as another strain compensation layer within the first component layer or within the second component layer, a plurality of strain compensation layers are easily disposed within the unit structure.

In the above-described semiconductor devices, the ratio z in $InSb_zAs_{1-z}$ forming the fifth component layer may be 0.3 or more. In this case, occurrence of lattice relaxation can be more strongly suppressed.

In the above-described semiconductor devices, the ratio x is preferably 0.9 or less. In the above-described semiconductor devices, the ratio y is preferably 0.9 or less. In the above-described semiconductor devices, the ratio z is preferably 0.9 or less. By thus setting the ratio of Sb to the group V elements forming such a strain compensation layer to 0.9 or less, good surface morphology is more easily maintained.

In the above-described semiconductor devices, $\Delta\omega$, which is a difference in w component between a zero-order satellite peak among X-ray (004) diffraction peaks of the III-V compound semiconductors forming the multiple quantum well structure and an X-ray (004) diffraction peak of GaSb forming the buffer layer, may be −400 seconds or more and 400 seconds or less.

In this case, strain applied to the multiple quantum well structure is reduced so that good surface morphology can be maintained with more certainty. In the present invention, $\Delta\omega$ denotes a value obtained by subtracting the $\omega$ component (angle corresponding to the peak position) of the X-ray (004) diffraction peak of GaSb forming the buffer layer from the w component of the zero-order satellite peak.

In the above-described semiconductor devices, the $\Delta\omega$ may be −100 seconds or more and 200 seconds or less. In this case, strain applied to the multiple quantum well structure is reduced and good surface morphology can be maintained with more certainty. Compared with the first component layer and the second component layer, good crystal growth is difficult to retain for the third component layer, the fourth component layer, and the fifth component layer serving as strain compensation layers. As the content of strain compensation layers in each unit structure increases, $\Delta\omega$ decreases. In order to maintain good surface morphology, $\Delta\omega$ is preferably made closer to 0. From the standpoint of difficulties in crystal growth of strain compensation layers, between two cases where $\Delta\omega$'s are positive and negative values that have the same magnitude with respect to 0, preferred is one of the cases where $\Delta\omega$ is a positive value so that the content of strain compensation layers is low in the unit structure. From this standpoint, the preferred range of $\Delta\omega$ has a wider positive value range.

In the above-described semiconductor devices, the ratio a in $InAs_{1-a}Sb_a$ forming the first component layer may be 0.005 or more. In this case, the tensile strain applied to the first component layer is reduced. Thus, it becomes easy to sufficiently suppress occurrence of lattice relaxation while maintaining good surface morphology.

In the above-described semiconductor devices, the ratio a in $InAs_{1-a}Sb_a$ forming the first component layer may be 0. In other words, the first component layer may be formed of InAs. In this case where the first component layer is formed of the binary compound, the composition of the components of the first component layer being formed can be easily adjusted.

In the above-described semiconductor devices, the substrate may be formed of GaSb. In this case, the substrate and the buffer layer are formed of the same substance, which facilitates production of semiconductor devices of high quality. In addition, the thickness of the buffer layer can be reduced, which contributes to an increase in production efficiency.

In the above-described semiconductor devices, the second component layer may have a thickness of 4 nm or more and 7 nm or less. By forming the second component layer so as to have a thickness of 4 nm or more, good surface morphology is easily maintained. In a case where the second component layer is formed so as to have a thickness of more than 7 nm, the overlap between wave functions in the multiple quantum well structure is reduced, which may result in degradation of absorption characteristics of the absorption layer. For these reasons, the second component layer is preferably formed so as to have a thickness of 4 nm or more and 7 nm or less.

In the above-described semiconductor devices, the III-V compound semiconductors forming the multiple quantum well structure preferably have a carbon concentration of $1 \times 10^{16}$ $cm^{-3}$ or less. Carbon functions as an acceptor in the multiple quantum well structure. Accordingly, an increase in the carbon concentration results in an increase in the carrier concentration in the multiple quantum well structure. As a result, during operation, the voltage required for making the multiple quantum well structure depleted is increased. In addition, in the multiple quantum well structure, carbon forms non-luminescent centers, which may result in a decrease in the sensitivity. The occurrence of such problems can be suppressed by setting the III-V compound semiconductors forming the multiple quantum well structure so as to have a carbon concentration of $1 \times 10^{16}$ cm$^{-3}$ or less.

In the above-described semiconductor devices, the multiple quantum well structure may be formed by metal-organic vapor phase epitaxy. In this case, the carbon concentration of the III-V compound semiconductors forming the multiple quantum well structure can be easily adjusted to be low.

DETAILED DESCRIPTION OF EMBODIMENTS

Hereinafter, semiconductor devices according to embodiments of the present invention will be described with reference to drawings. In the drawings, the same or corresponding part is denoted by the same reference numeral and the description thereof is not repeated.

Referring to FIG. 1, an infrared photodiode that is a semiconductor device according to an embodiment will be described. An infrared photodiode 1 in FIG. 1 includes a substrate 20 formed of a III-V compound semiconductor, a buffer layer 30 formed of GaSb, a multiple quantum well structure 40 serving as an absorption layer formed of III-V compound semiconductors, and a contact layer 50.

The substrate 20 is formed of a III-V compound semiconductor. Examples of the III-V compound semiconductor forming the substrate 20 include GaSb (gallium antimonide), InAs (indium arsenide), GaAs (gallium arsenide), and InP (indium phosphide). Use of the substrate 20 formed of such a III-V compound semiconductor facilitates production of the infrared photodiode 1 as a photodiode for mid-infrared light.

The buffer layer 30 is disposed so as to be in contact with a main surface 20A of the substrate 20. The buffer layer 30 is formed of GaSb of p-type conductivity (p-GaSb), for example. Examples of a p-type impurity contained in the buffer layer 30 include Zn (zinc), C (carbon), and Be (beryllium). The mismatch between the lattice constant of p-GaSb forming the buffer layer 30 and the lattice constant of an ideal crystal of GaSb is 0.01% or less.

Referring to FIG. 1, the multiple quantum well structure 40 serving as the absorption layer is disposed so as to be in contact with a main surface 30A of the buffer layer 30, the main surface 30A being on the side of the buffer layer 30 opposite to the other main surface facing the substrate 20. The multiple quantum well structure 40 includes a stack of unit structures 41 each including a plurality of component layers. In other words, a plurality of the unit structures 41 are stacked to form the multiple quantum well structure 40. The internal configuration of each of the unit structures 41 will be described below. The thickness of the multiple quantum well structure 40 is not particularly limited; and the thickness may be 500 nm or more, for example, from the standpoint of enhancing the sensitivity. The multiple quantum well structure 40 is a type-II quantum well.

Referring to FIG. 1, the contact layer 50 is disposed so as to be in contact with a main surface 40A of the multiple quantum well structure 40, the main surface 40A being on the side of the multiple quantum well structure 40 opposite to the other main surface facing the buffer layer 30. The contact layer 50 is formed of a III-V compound semiconductor.

Examples of the III-V compound semiconductor forming the contact layer 50 include InAs (indium arsenide), GaSb (gallium antimonide), GaAs (gallium arsenide), InP (indium phosphide), and InGaAs (indium gallium arsenide). Specifically, InAs of n-type conductivity (n-InAs) is employed as the compound semiconductor forming the contact layer 50, for example. Examples of an n-type impurity contained in the contact layer 50 include Si (silicon) and Te (tellurium).

In the infrared photodiode 1, trenches 99 are formed so as to extend through the contact layer 50 and the multiple quantum well structure 40 and to reach the buffer layer 30. On side walls 99A of the trenches 99, the contact layer 50 and the multiple quantum well structure 40 are exposed. Bottom surfaces 99B of the trenches 99 are positioned at a level between the top surface and the bottom surface of the buffer layer 30.

The infrared photodiode 1 also includes a passivation film 80, a p-electrode 91, and an n-electrode 92. The passivation film 80 is disposed so as to cover the bottom surfaces 99B of the trenches 99, the side walls 99A of the trenches 99, and a main surface 50A of the contact layer 50, the main surface 50A being on the side of the contact layer 50 opposite to the other main surface facing the multiple quantum well structure 40. The passivation film 80 is formed of an insulator such as silicon nitride or silicon oxide.

In a region of the passivation film 80, the region covering the bottom surface 99B of the trench 99, an opening 81 is formed so as to extend through the passivation film 80 in the thickness direction. The p-electrode 91 is disposed so as to fill the opening 81. The p-electrode 91 is disposed so as to be in contact with the buffer layer 30 exposed in the opening 81. The p-electrode 91 is formed of a conductor such as metal. More specifically, the p-electrode 91 may have a configuration of Ti (titanium)/Pt (platinum)/Au (gold), for example. The p-electrode 91 forms an ohmic contact with the buffer layer 30.

In another region of the passivation film 80, the region covering the main surface 50A of the contact layer 50, an opening 82 is formed so as to extend through the passivation film 80 in the thickness direction. The n-electrode 92 is disposed so as to fill the opening 82. The n-electrode 92 is disposed so as to be in contact with the contact layer 50 exposed in the opening 82. The n-electrode 92 is formed of a conductor such as metal. More specifically, the n-electrode 92 may have a configuration of Ti/Pt/Au, for example. The n-electrode 92 forms an ohmic contact with the contact layer 50.

The n-electrode 92 is a pixel electrode. The infrared photodiode 1 may include a single n-electrode 92 only as a pixel electrode as illustrated in FIG. 1. Alternatively, the infrared photodiode I may include a plurality of pixel electrodes (n-electrodes 92). Specifically, the infrared photodiode 1 may include a plurality of structures that are each illustrated in FIG. 1 and that are arranged in the direction in which the main surface 20A of the substrate 20 extends in FIG. 1. In this case, the infrared photodiode 1 has a plurality of the n-electrodes 92 corresponding to pixels, whereas it has a single p-electrode 91.

Figure 2:
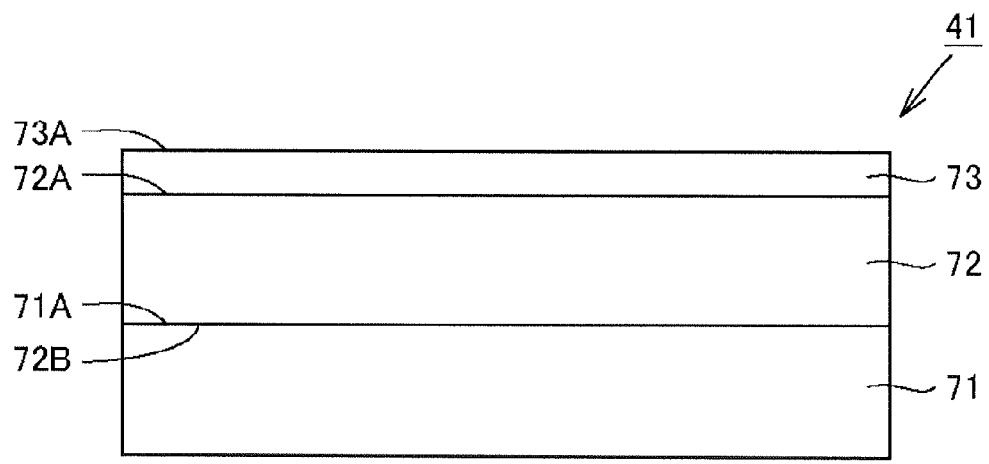
FIG. 2 is a schematic sectional view illustrating an example of a unit structure of a multiple quantum well structure.

Hereinafter, the internal configuration of each of the unit structures 41 will be described. Referring to FIG. 2, the unit structure 41 includes a first component layer 71 formed of InAs$_{1-a}$Sb$_a$, a second component layer 72 formed of GaSb, and a third component layer 73 formed of InSb$_x$As$_{1-x}$. More specifically, the second component layer 72 is disposed so as to be in contact with a main surface 71A of the first component layer 71. The third component layer 73 is disposed so as to be in contact with a main surface 72A of the second component layer 72. The difference in lattice constant between the crystals forming the first component layer 71 and the crystals forming the buffer layer 30 causes tensile stress to be applied to the first component layer 71. The difference in lattice constant between the crystals forming the third component layer 73 and the crystals forming the buffer layer 30 causes compressive stress to be applied to the third component layer 73. Thus, the third component layer 73 compensates for the tensile stress applied to the first component layer 71. That is, the third component layer 73 serves as a strain compensation layer disposed within the unit structure 41.

In the unit structure 41, the third component layer 73 serving as a strain compensation layer is disposed so as to be in contact with one main surface 72A of the second component layer 72. The other main surface 72B of the second component layer 72 is in contact with the first component layer 71 present within the unit structure 41. In other words, within the unit structure 41, the third component layer 73 serving as a strain compensation layer is disposed only on one main-surface side of the second component layer 72. In $InSb_xAs_{1-x}$ forming the third component layer 73, the ratio x is more than 0 and less than 1. In $InAs_{1-a}Sb_a$ forming the first component layer 71, the ratio a is 0 or more and 0.05 or less. The third component layer 73 has a thickness of 0.1 nm or more and 0.9 nm or less.

Referring to FIG. 1, infrared rays having entered the infrared photodiode 1 are absorbed between quantum levels in the multiple quantum well structure 40, resulting in generation of electron-hole pairs. The generated electrons and holes are output from the infrared photodiode 1 as photocurrent signals. Thus, infrared rays are detected.

In the infrared photodiode 1 of this embodiment, the third component layer 73 formed of InSbAs and serving as a strain compensation layer is introduced in each of the unit structures 41 including the first component layer 71 formed of $InAs_{1-a}Sb_a$ (the ratio a is 0 or more and 0.05 or less) and the second component layer 72 formed of GaSb, the unit structures 41 being stacked to provide the multiple quantum well structure 40. The third component layer 73 is formed of a III-V compound semiconductor that is InSb doped with As. Thus, while good surface morphology is maintained, sufficiently high compressive stress is applied to the third component layer 73. As a result, in the multiple quantum well structure 40, good surface morphology is maintained and occurrence of lattice relaxation can be sufficiently suppressed. In this embodiment, the strain compensation layer (third component layer 73) is disposed only on one main-surface side of the second component layer 72. Thus, occurrence of lattice relaxation can be suppressed without making production processes considerably complicated. The third component layer 73 has a thickness of 0.1 nm or more and 0.9 nm or less. The third component layer 73 is formed so as to have a thickness in this range, so that good surface morphology is maintained and the effect of suppressing occurrence of lattice relaxation can be sufficiently provided.

As has been described, the infrared photodiode 1 of this embodiment includes, within the multiple quantum well structure 40 forming an absorption layer, the third component layers 73 that serve as strain compensation layers and can sufficiently suppress occurrence of lattice relaxation while good surface morphology is maintained. As a result, the number of the unit structures 41 repeated in the multiple quantum well structure 40 can be sufficiently increased. As a result, the infrared photodiode 1 of this embodiment has a sufficiently high sensitivity.

Figure 3:
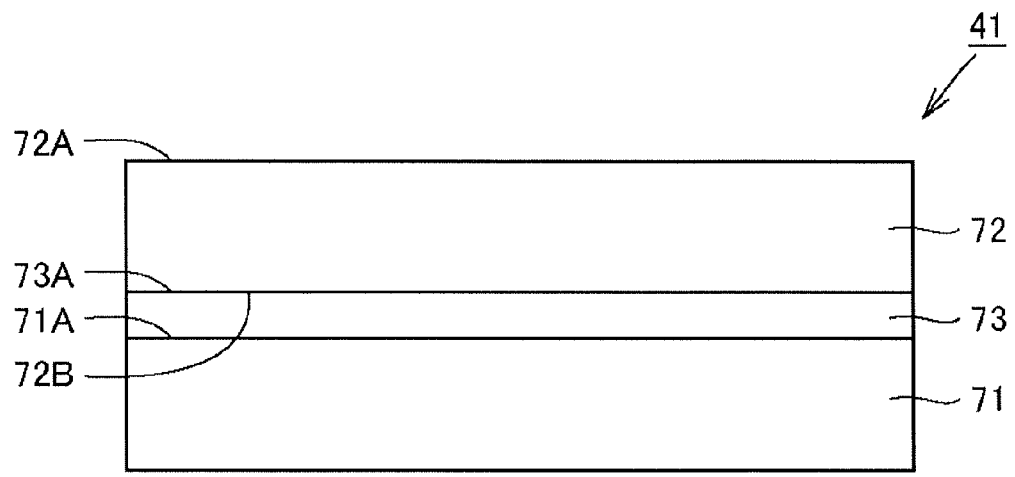
FIG. 3 is a schematic sectional view illustrating an example of a unit structure of a multiple quantum well structure.

Hereinafter, modifications of unit structures 41 forming the multiple quantum well structure 40 will be described. FIG. 3 illustrates the configuration of a unit structure 41 according to a first modification. The unit structure 41 in the first modification in FIG. 3 and the unit structure 41 described above with reference to FIG. 2 share the feature that the third component layer 73 serving as a strain compensation layer is disposed so as to be in contact with only one main surface of the second component layer 72. However, the unit structure 41 in the first modification is different from the unit structure 41 described above with reference to FIG. 2 in that the third component layer 73 is disposed between the first component layer 71 and the second component layer 72. Specifically, in the unit structure 41 in the first modification, the third component layer 73 is disposed so as to be in contact with the main surface 71A of the first component layer 71. The second component layer 72 is disposed so as to be in contact with the main surface 73A of the third component layer 73. In this unit structure 41, the third component layer 73 is disposed so as to be in contact with one main surface 72B of the second component layer 72. The other main surface 72A of the second component layer 72 is in contact with a first component layer 71 present within another unit structure (refer to FIG. 1) disposed on the unit structure 41. Such a configuration of the first modification can also provide advantages similar to those of the above-described embodiment.

Figure 4:
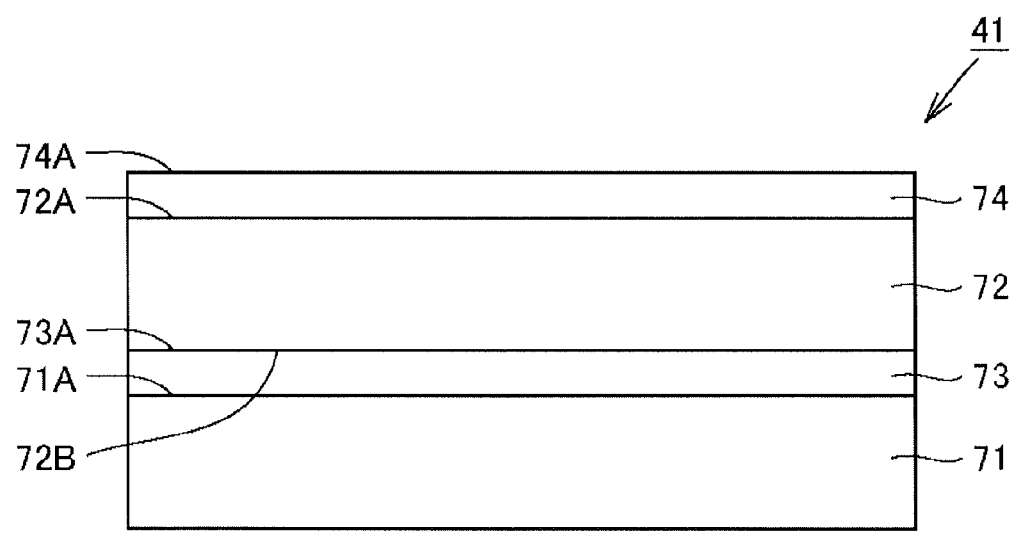
FIG. 4 is a schematic sectional view illustrating an example of a unit structure of a multiple quantum well structure.

FIG. 4 illustrates the configuration of a unit structure 41 according to a second modification. The unit structure 41 in the second modification in FIG. 4 is different from the unit structure 41 of the above-described embodiment in that strain compensation layers are disposed on both main surfaces of the second component layer 72. Specifically, in the unit structure 41 of the second modification, the third component layer 73 is disposed so as to be in contact with the main surface 71A of the first component layer 71. The second component layer 72 is disposed so as to be in contact with the main surface 73A of the third component layer 73. A fourth component layer 74 is disposed so as to be in contact with the main surface 72A of the second component layer 72. That is, in the unit structure 41, the third component layer 73 is disposed so as to be in contact with one main surface 72B of the second component layer 72. The fourth component layer 74 is disposed so as to be in contact with the other main surface 72A of the second component layer 72. The fourth component layer 74 is formed of $InSb_yAs_{1-y}$. In $InSb_yAs_{1-y}$ forming the fourth component layer 74, the ratio y is 0.3 or more and less than 1. The fourth component layer 74 has a thickness of 0.1 nm or more and 0.9 nm or less.

The difference in lattice constant between the crystals forming the fourth component layer 74 and the crystals forming the buffer layer 30 causes compressive stress to be applied to the fourth component layer 74. Thus, the fourth component layer 74 compensates for the tensile stress applied to the first component layer 71. That is, the fourth component layer 74 is a strain compensation layer disposed within the unit structure 41. In this modification, the strain compensation layers (third component layer 73 and fourth component layer 74) are respectively disposed so as to be in contact with one main surface 72B and the other main surface 72A of the second component layer 72. Thus, the occurrence of lattice relaxation can be more strongly suppressed without considerably increasing the thickness of the strain compensation layers. As a result, the number of unit structures included in the multiple quantum well structure 40 can be increased, to thereby enhance the sensitivity of the infrared photodiode 1. In addition, the degree of freedom with which the infrared photodiode is designed is enhanced. For example, an infrared photodiode for a long cutoff wavelength can be easily designed.

In such a case where strain compensation layers (third component layer 73 and fourth component layer 74) are respectively disposed so as to be in contact with one main surface 72B and the other main surface 72A of the second component layer 72, the ratio y in $InSb_yAs_{1-y}$ forming the fourth component layer 74 is set to 0.3 or more and less than 1. By setting the ratio y, which is the ratio of Sb to the group V elements forming the strain compensation layer, to 0.3 or more, occurrence of lattice relaxation can be strongly suppressed. In this modification, the position of the third component layer 73 and the position of the fourth component layer 74 may be exchanged. In this case, the fourth component layer 74 is disposed so as to be in contact with the main surface 71A of the first component layer 71. The second component layer 72 is disposed so as to be in contact with the main surface 74A of the fourth component layer 74. The third component layer 73 is disposed so as to be in contact with the main surface 72A of the second component layer 72.

In the above-described embodiment, the first modification, and the second modification, the ratio x in $InSb_xAs_{1-x}$ forming the third component layer is more than 0 and less than 1. By setting the ratio x to 0.3 or more, the occurrence of lattice relaxation can be more strongly suppressed.

Figure 5:
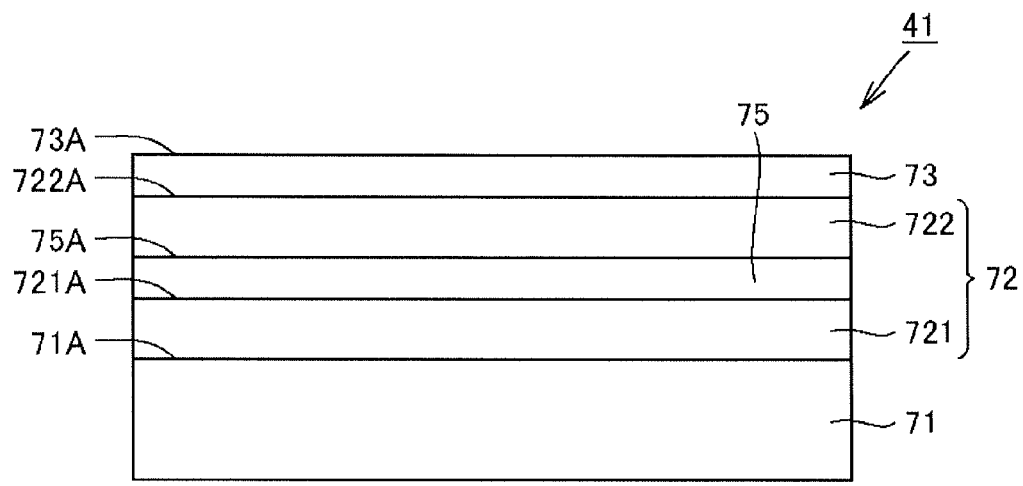
FIG. 5 is a schematic sectional view illustrating an example of a unit structure of a multiple quantum well structure.

FIG. 5 illustrates the configuration of a unit structure 41 according to a third modification. In this modification in FIG. 5, a fifth component layer 75 is disposed within the second component layer 72 in the unit structure 41 of the embodiment described above with reference to FIG. 2. Specifically, in the unit structure 41 of the third modification, a lower second component layer 721 is disposed so as to be in contact with the main surface 71A of the first component layer 71. The fifth component layer 75 is disposed so as to be in contact with a main surface 721A of the lower second component layer 721. An upper second component layer 722 is disposed so as to be in contact with a main surface 75A of the fifth component layer 75. The third component layer 73 is disposed so as to be in contact with a main surface 722A of the upper second component layer 722. The lower second component layer 721 and the upper second component layer 722 constitute the second component layer 72. That is, the fifth component layer 75 is placed within the second component layer 72.

The fifth component layer 75 is formed of $InSb_zAs_{1-z}$. In $InSb_zAs_{1-z}$ forming the fifth component layer 75, the ratio z is more than 0 and less than 1. By setting the ratio z to 0.3 or more, the occurrence of lattice relaxation can be more strongly suppressed. The fifth component layer 75 has a thickness of 0.1 nm or more and 0.9 nm or less.

The difference in lattice constant between the crystals forming the fifth component layer 75 and the crystals forming the buffer layer 30 causes compressive stress to be applied to the fifth component layer 75. Thus, the fifth component layer 75 compensates for the tensile stress applied to the first component layer 71. That is, the fifth component layer 75 serves as a strain compensation layer disposed within the unit structure 41. In this unit structure 41, the occurrence of lattice relaxation can be more strongly suppressed without considerably increasing the thickness of the strain compensation layers.

The component layers within the unit structure 41 can be sequentially stacked by changing source gases supplied in accordance with the predetermined timetable, for example. In a case where there is a technical difficulty in changing source gases from, for example, those for forming the $InAs_{1-a}Sb_a$ layer serving as the first component layer to those for forming the InSbAs layer serving as the strain compensation layer to thereby change crystals formed during production, this difficulty can be avoided by employing the unit structure of this modification.

Figure 6:
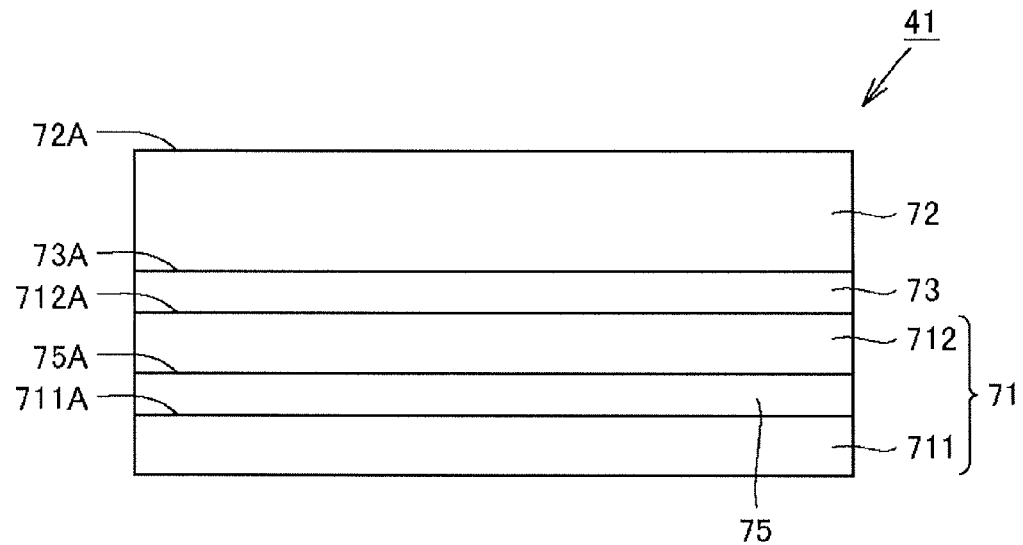
FIG. 6 is a schematic sectional view illustrating an example of a unit structure of a multiple quantum well structure.

FIG. 6 illustrates the configuration of a unit structure 41 according to a fourth modification. In this modification in FIG. 6, a fifth component layer 75 is disposed within the first component layer 71 in the unit structure 41 of the first modification described above with reference to FIG. 3. Specifically, in the unit structure 41 of the fourth modification, the fifth component layer 75 is disposed so as to be in contact with a main surface 711A of a lower first component layer 711. An upper first component layer 712 is also disposed so as to be in contact with a main surface 75A of the fifth component layer 75. The third component layer 73 is disposed so as to be in contact with a main surface 712A of the upper first component layer 712. The second component layer 72 is disposed so as to be in contact with the main surface 73A of the third component layer 73. The lower first component layer 711 and the upper first component layer 712 constitute the first component layer 71. That is, the fifth component layer 75 is placed within the first component layer 71. The fifth component layer 75 is a strain compensation layer that has the same configuration as in the third modification. In a case where there is a technical difficulty in changing source gases from, for example, those for forming the GaSb layer serving as the second component layer to those for forming the InSbAs layer serving as the strain compensation layer to thereby change crystals formed during production, this difficulty can be avoided by employing the unit structure of this modification.

In the infrared photodiode 1, $\Delta\omega$, which is a difference in co component between a zero-order satellite peak among X-ray (004) diffraction peaks of the III-V compound semiconductors forming the multiple quantum well structure 40 and an X-ray (004) diffraction peak of GaSb forming the buffer layer 30, is preferably −400 seconds or more and 400 seconds or less. In this case, good surface morphology can be maintained with more certainty.

The $\Delta\omega$ is more preferably −100 seconds or more and 200 seconds or less. In this case, good surface morphology can be maintained with even more certainty.

In $InAs_{1-a}Sb_a$ forming the first component layer 71, the ratio a may be 0.005 or more. In this case, the tensile strain applied to the first component layer 71 is reduced. As a result, it becomes easy to sufficiently suppress occurrence of lattice relaxation while good surface morphology is maintained.

In $InAs_{1-a}Sb_a$ forming the first component layer 71, the ratio a may be 0. In other words, the first component layer 71 may be formed of InAs. In this case where the first component layer 71 is formed of the binary compound, the composition of the components of the first component layer 71 being formed can be easily adjusted.

The substrate 20 may be formed of GaSb. In this case, the substrate 20 and the buffer layer 30 are formed of the same substance, which allows growth of crystals of high quality. In addition, the thickness of the buffer layer 30 can be reduced, which contributes to an increase in production efficiency.

The second component layer 72 may have a thickness of 4 nm or more and 7 nm or less. By forming the second component layer 72 so as to have a thickness of 4 nm or more, good surface morphology is easily maintained. In a case where the second component layer 72 is formed so as to have a thickness of more than 7 nm, the overlap between wave functions in the multiple quantum well structure 40 is reduced, which may result in degradation of absorption characteristics of the absorption layer. For these reasons, the second component layer 72 is preferably formed so as to have a thickness of 4 nm or more and 7 nm or less.

The III-V compound semiconductors forming the multiple quantum well structure 40 preferably have a carbon concentration of $1 \times 10^{16}$ cm$^{-3}$ or less. Carbon functions as an acceptor in the multiple quantum well structure 40. Accordingly, an increase in the carbon concentration results in an increase in the carrier concentration in the multiple quantum well structure 40. As a result, during operation, the voltage required for making the multiple quantum well structure 40 depleted is increased. In addition, in the multiple quantum well structure 40, carbon forms non-luminescent centers, which may result in a decrease in the sensitivity. The occurrence of such problems can be suppressed by setting the III-V compound semiconductors forming the multiple quantum well structure 40 so as to have a carbon concentration of $1 \times 10^{16}$ $cm^{-3}$ or less.

The multiple quantum well structure 40 may be formed by metal-organic vapor phase epitaxy. In this case, the carbon concentration of the III-V compound semiconductors forming the multiple quantum well structure 40 can be easily adjusted to be low.

Figure 7:
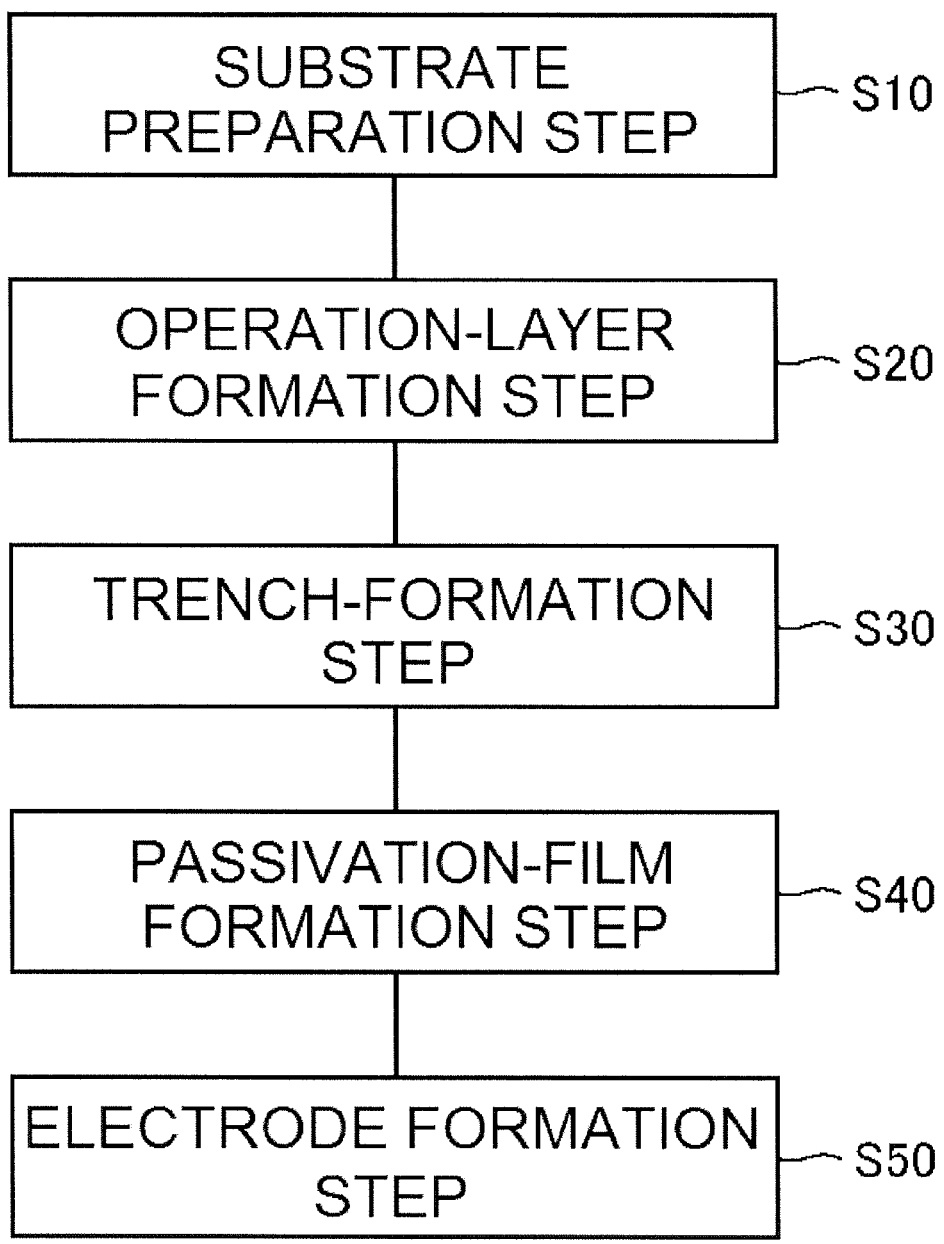
FIG. 7 is a flow chart illustrating the overview of a method for producing a photodiode.
Figure 8:
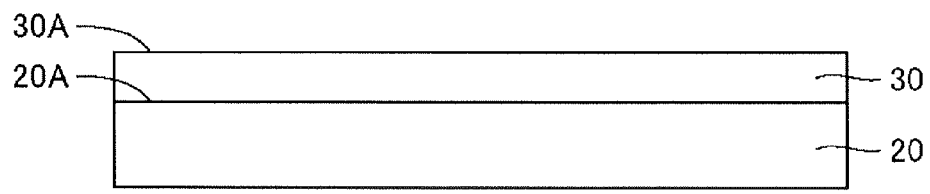
FIG. 8 is a schematic sectional view illustrating an example of a method for producing a photodiode.

Hereinafter, the overview of a method for producing the infrared photodiode 1 according to the embodiment will be described. Referring to FIG. 7, the method for producing the infrared photodiode 1 according to the embodiment begins with a substrate preparation step as Step S10. Referring to FIG. 8, in this Step S10, a substrate 20 having a diameter of 2 inches (50.8 mm) and formed of a III-V compound semiconductor (for example, GaSb) is prepared, for example. More specifically, an ingot formed of GaSb is sliced to provide the substrate 20 formed of GaSb, for example. The substrate 20 is subjected to surface polishing and then to processes including washing. As a result, the substrate 20 is prepared so as to have a main surface 20A having high planarity and high cleanliness.

Subsequently, an operation-layer formation step is carried out as Step S20. In this Step S20, an operation layer including a buffer layer 30, a multiple quantum well structure 40, and a contact layer 50 is formed on the main surface 20A of the substrate 20 prepared in Step S10. This operation layer can be formed by metal-organic vapor phase epitaxy, for example. The operation layer can be formed by metal-organic vapor phase epitaxy in the following manner, for example: the substrate 20 is placed on a rotation table equipped with a heater for heating a substrate; and, while the substrate 20 is heated with the heater, source gases are supplied onto the substrate 20.

Specifically, referring to FIG. 8, the buffer layer 30 formed of p-GaSb is formed by metal-organic vapor phase epitaxy so as to be in contact with the main surface 20A of the substrate 20, for example. In the formation of the buffer layer 30 formed of p-GaSb, examples of a Ga source include triethylgallium (TEGa) and trimethylgallium (TMGa); and examples of an Sb source include trimethylantimony (TMSb), triethylantimony (TESb), tri isopropylantimony (TIPSb), trisdimethylaminoantimony (TDMASb), and tritertiarybutylantimony (TTBSb). In a case of using C as a p-type impurity for doping, $CBr_4$ (carbon tetrabromide) or $CCl_4$ (carbon tetrachloride) can be added to source gases, for example.

Subsequently, referring to FIGS. 8 and 9, the multiple quantum well structure 40 is formed so as to be in contact with a main surface 30A of the buffer layer 30, the main surface 30A being on the side of the buffer layer 30 opposite to the other main surface facing the substrate 20. The multiple quantum well structure 40 is formed by stacking a plurality of the unit structures 41 described above with reference to FIGS. 2 to 6, for example. Following the formation of the buffer layer 30, the multiple quantum well structure 40 can also be formed by metal-organic vapor phase epitaxy. Specifically, the multiple quantum well structure 40 can be formed on the substrate 20 being placed within the apparatus used for forming the buffer layer 30, by using source gases different from those used for forming the buffer layer 30. Thus, the multiple quantum well structure 40, which is a type-II quantum well, can be formed.

In the formation of the component layers forming the unit structures 41, examples of an In source include trimethylindium (TMIn) and triethylindium (TEIn). Examples of an As source include tertiarybutylarsine (TBAs) and trimethylarsenic (TMAs). Examples of a Ga source include TEGa and TMGa. Examples of an Sb source include TMSb, TESb, TIPSb, TDMASb, and TTBSb.

Subsequently, referring to FIGS. 9 and 10, the contact layer 50 formed of a III-V compound semiconductor such as n-InAs is formed so as to be in contact with a main surface 40A of the multiple quantum well structure 40, the main surface 40A being on the side of the multiple quantum well structure 40 opposite to the other main surface facing the buffer layer 30. Following the formation of the multiple quantum well structure 40, the contact layer 50 can be formed by metal-organic vapor phase epitaxy. Specifically, the contact layer 50 can be formed on the substrate 20 being placed within the apparatus used for forming the multiple quantum well structure 40, by using source gases different from those used for forming the multiple quantum well structure 40. In a case of using Si as an n-type impurity for doping, tetraethylsilane (TeESi) can be added to source gases, for example.

The above-described procedures are carried out to thereby complete a semiconductor layered structure 10 according to this embodiment. As described above, Step S20 is carried out by metal-organic vapor phase epitaxy to thereby increase the production efficiency of the semiconductor layered structure 10. The manner in which Step S20 is carried out is not limited to metal-organic vapor phase epitaxy using only metal-organic sources. Step S20 may be carried out by another metal-organic vapor phase epitaxy using hydrides such as $AsH_3$ (arsine) serving as the As source and $SiH_4$ (silane) serving as the Si source. Alternatively, Step S20 can be carried out by a process other than metal-organic vapor phase epitaxy, such as molecular beam epitaxy (MBE).

Figure 10:
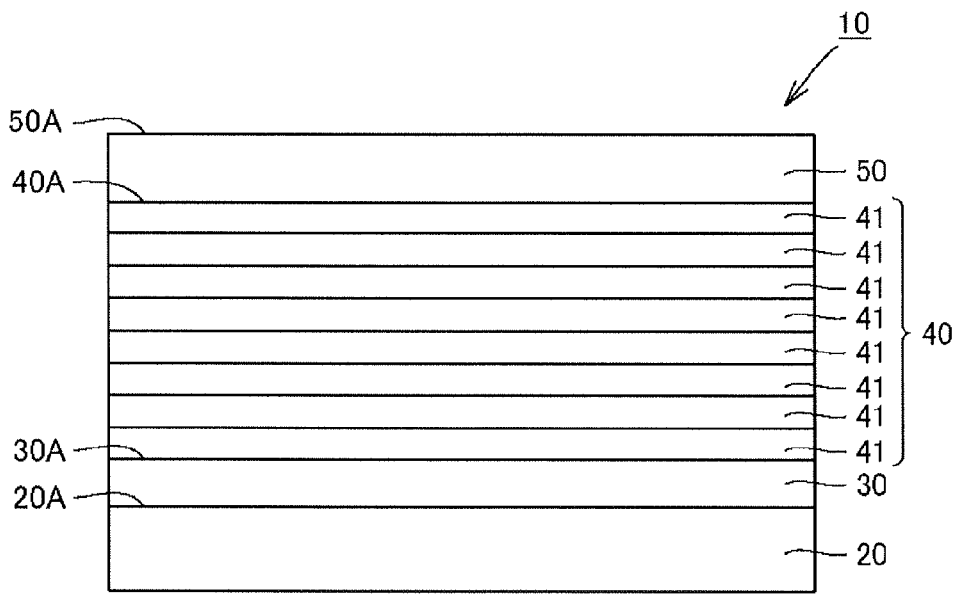
FIG. 10 is a schematic sectional view illustrating an example of a method for producing a photodiode.
Figure 11:
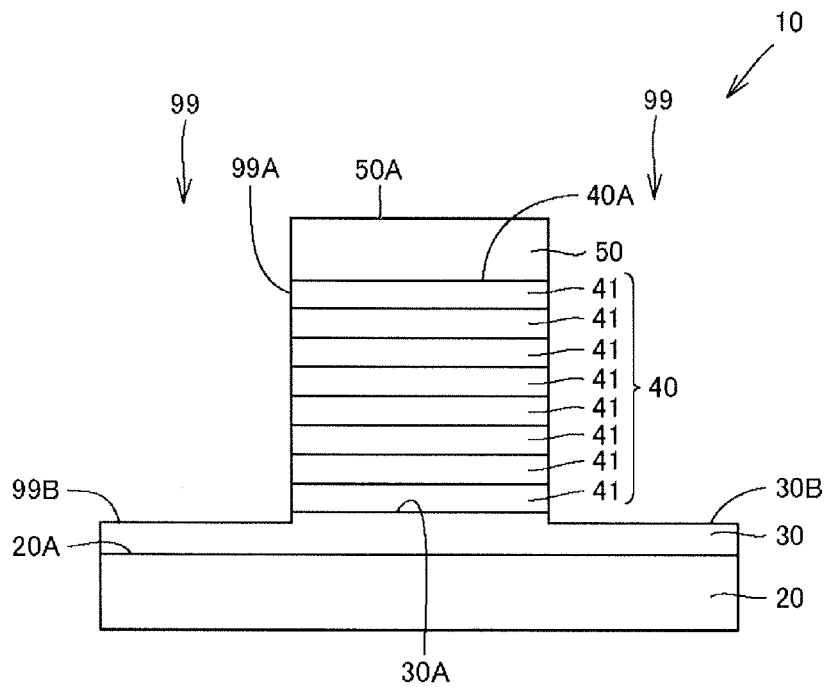
FIG. 11 is a schematic sectional view illustrating an example of a method for producing a photodiode.

Subsequently, referring to FIG. 7, a trench-formation step is carried out as Step S30. Referring to FIGS. 10 and 11, in Step S30, trenches 99 are formed, in the semiconductor layered structure 10 produced above by Steps S10 and S20, so as to extend through the contact layer 50 and the multiple quantum well structure 40 and to reach the buffer layer 30. The trenches 99 can be formed by forming a mask layer having openings corresponding to the shapes of the trenches 99, on the main surface 50A of the contact layer 50, and by carrying out etching, for example.

Subsequently, a passivation-film formation step is carried out as Step S40.

Figure 12:
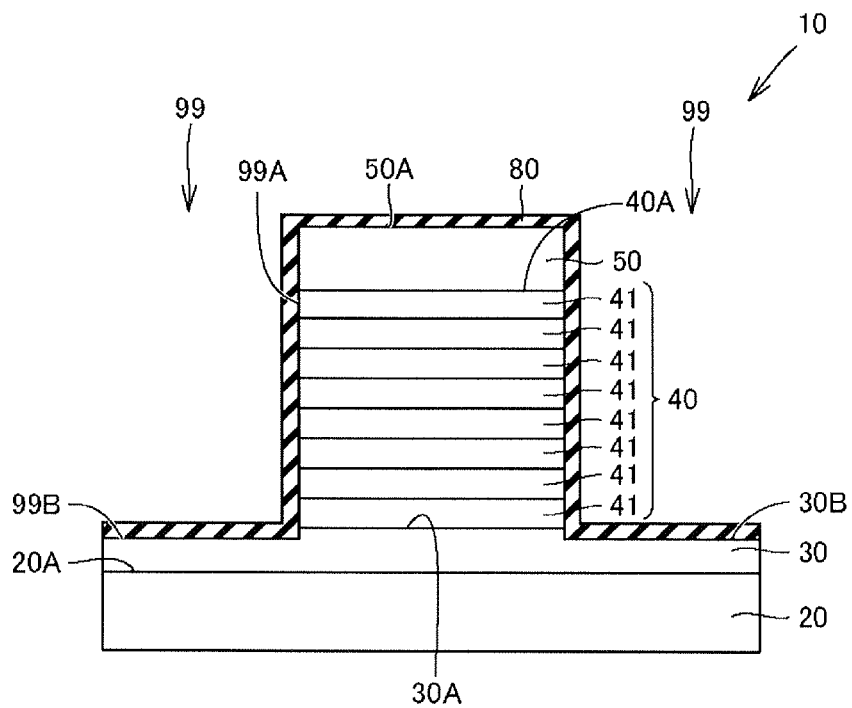
FIG. 12 is a schematic sectional view illustrating an example of a method for producing a photodiode.

Referring to FIGS. 11 and 12, in Step S40, a passivation film 80 is formed on the semiconductor layered structure 10 in which the trenches 99 are formed in Step S30. Specifically, the passivation film 80 formed of an insulator such as silicon oxide or silicon nitride is formed by chemical vapor deposition (CVD), for example. The passivation film 80 is formed so as to cover bottom surfaces 99B of the trenches 99, side walls 99A of the trenches 99, and the main surface 50A of the contact layer 50, the main surface 50A being on the side of the contact layer 50 opposite to the other main surface facing the multiple quantum well structure 40.

Subsequently, an electrode formation step is carried out as Step S50. Referring to FIGS. 12 and 1, in Step S50, a p-electrode 91 and an n-electrode 92 are formed in the semiconductor layered structure 10 in which the passivation film 80 is formed in Step S40. Specifically, for example, a mask is formed on the passivation film 80 so as to have openings at positions corresponding to regions where the p-electrode 91 and the n-electrode 92 are to be formed; and this mask is used to form an opening 81 and an opening 82 in the passivation film 80. After that, the p-electrode 91 and the n-electrode 92 formed of an appropriate conductor are formed by vapor deposition, for example. The above-described Steps are thus carried out to complete the infrared photodiodes 1 according to the embodiment. After that, the infrared photodiodes 1 are divided by dicing, for example.

EXAMPLE 1

The relationships between a strain compensation layer and $\Delta\omega$ in terms of different configurations of unit structures of multiple quantum well structures were used to examine appropriate configurations of the unit structures. Two types of unit structures were designed: the unit structure of the above-described embodiment (single-side compensation-layer type) described with reference to FIG. 2 and the unit structure of the second modification (double-side compensation-layer type) described with reference to FIG. 4. The unit structures of these types were examined to determine variation in $\Delta\omega$ depending on changes in the ratio of Sb to the group V elements forming the strain compensation layer. The results are illustrated in FIGS. 13 to 18. In FIGS. 13 to 18, the abscissa axis indicates the ratio of Sb to the group V elements forming the strain compensation layer (third component layer 73 and fourth component layer 74). In FIGS. 13 to 18, the ordinate axis indicates $\Delta\omega$. In each of FIGS. 13 to 18, the solid line indicates a case where the second component layer formed of GaSb has a thickness of 2 nm; the broken line indicates a case where the second component layer formed of GaSb has a thickness of 4 nm; and the alternate long and short dashed line indicates a case where the second component layer formed of GaSb has a thickness of 6 nm.

Figure 13:
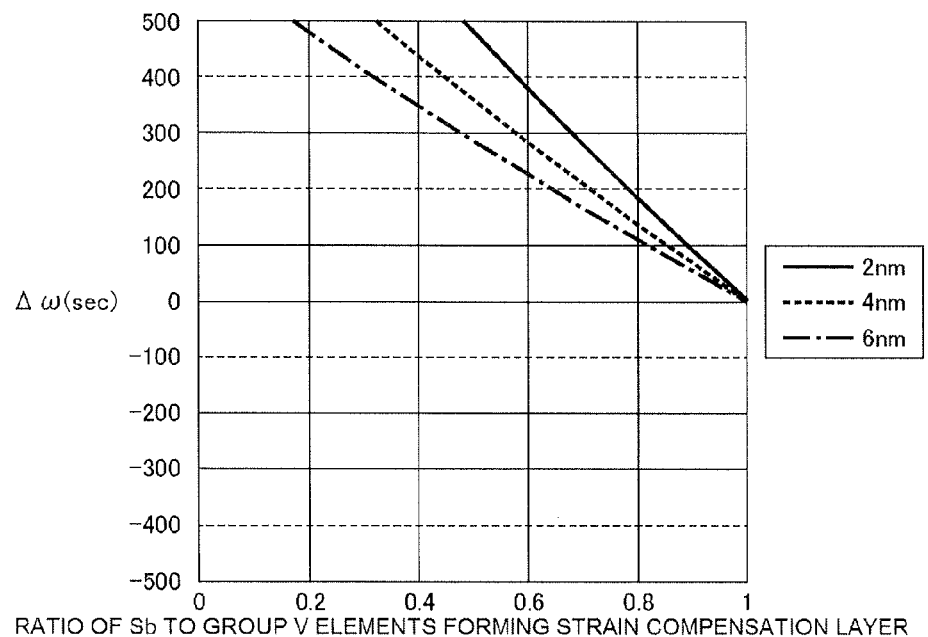
FIG. 13 is a graph illustrating the relationships between the composition of a strain compensation layer and Δω.
Figure 14:
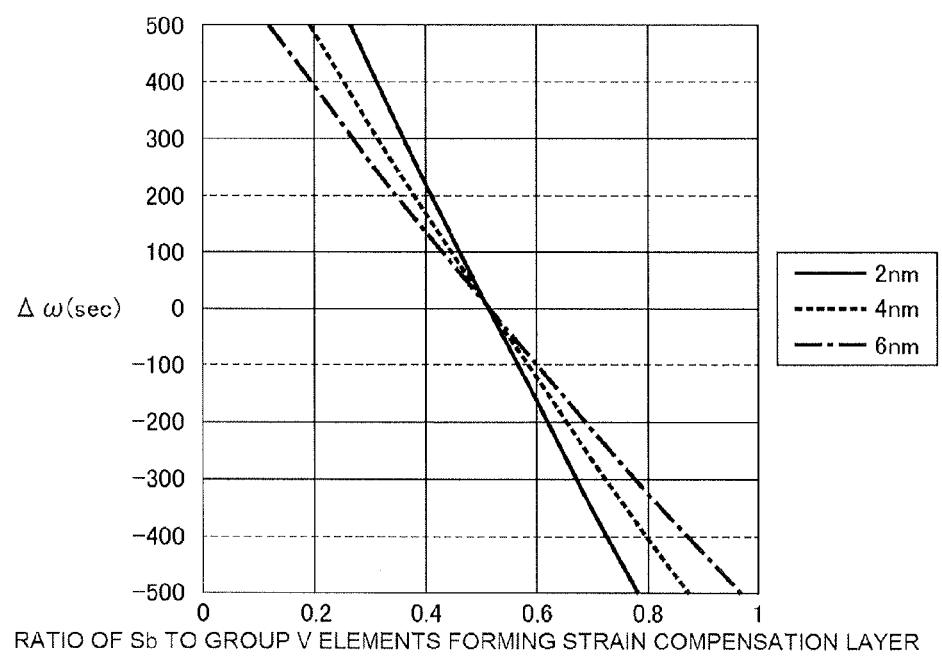
FIG. 14 is a graph illustrating the relationships between the composition of a strain compensation layer and Δω.

Referring to FIGS. 13 and 14, cases of designing an absorption layer for a 6 μm wavelength band will be described. FIGS. 13 and 14 illustrate relationships between the Sb ratio and $\Delta\omega$ in cases where an absorption layer is designed for a 6 μm wavelength band and the first component layer 71 has a thickness of 3.5 nm and is formed of InAs. FIG. 13 indicates cases corresponding to a single-side compensation-layer type in which a third component layer having a thickness of 0.4 nm is formed as a strain compensation layer. FIG. 14 indicates cases corresponding to a double-side compensation-layer type in which a third component layer having a thickness of 0.4 nm and a fourth component layer having a thickness of 0.4 nm are formed as strain compensation layers. Referring to FIGS. 13 and 14, with regard to both of the single-side compensation-layer type and the double-side compensation-layer type, by setting the Sb ratio to appropriate values in the range of 0.3 or more, $\Delta\omega$ can be made to fall within the range of −400 seconds or more and 400 seconds or less and also within the range of −100 seconds or more and 200 seconds or less. In a case where $\Delta\omega$ is in the range of −400 seconds or more and 400 seconds or less, about 100 periods of the unit structure 41 can be stacked without occurrence of lattice relaxation. In order to stack more than 100 periods of the unit structure 41, $\Delta\omega$ is set to be closer to 0: $\Delta\omega$ is preferably set to be in the range of −100 seconds or more and 200 seconds or less, for example. Thus, in order to stack more than 100 periods of the unit structure 41, the Sb ratio is set to 0.6 or more for the single-side compensation-layer type. For the double-side compensation-layer type, the Sb ratio is set to 0.3 or more to thereby allow more than 100 periods of the unit structure 41 to be stacked. In order to achieve a very large number of periods (stack layers) of the unit structure 41, the double-side compensation-layer type is advantageously employed because the Sb ratio is set to about 0.5 so that $\Delta\omega$ can be easily made to be closer to 0. In contrast, in cases where the number of the periods of the unit structure is relatively small, the single-side compensation-layer type is advantageously employed because of simple production steps.

Figure 15:
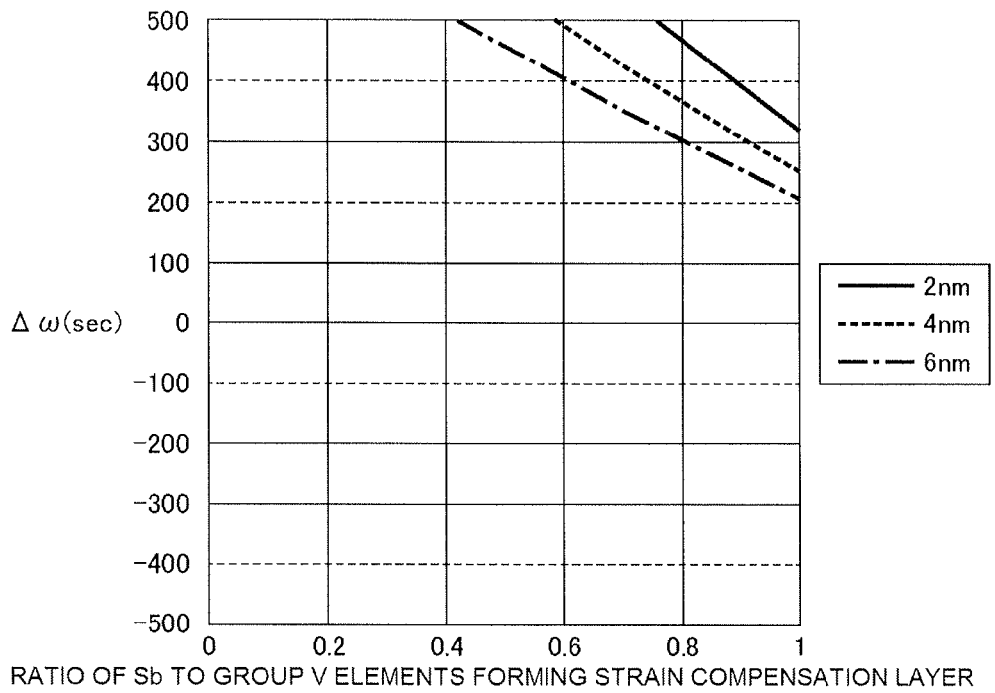
FIG. 15 is a graph illustrating the relationships between the composition of a strain compensation layer and Δω.
Figure 16:
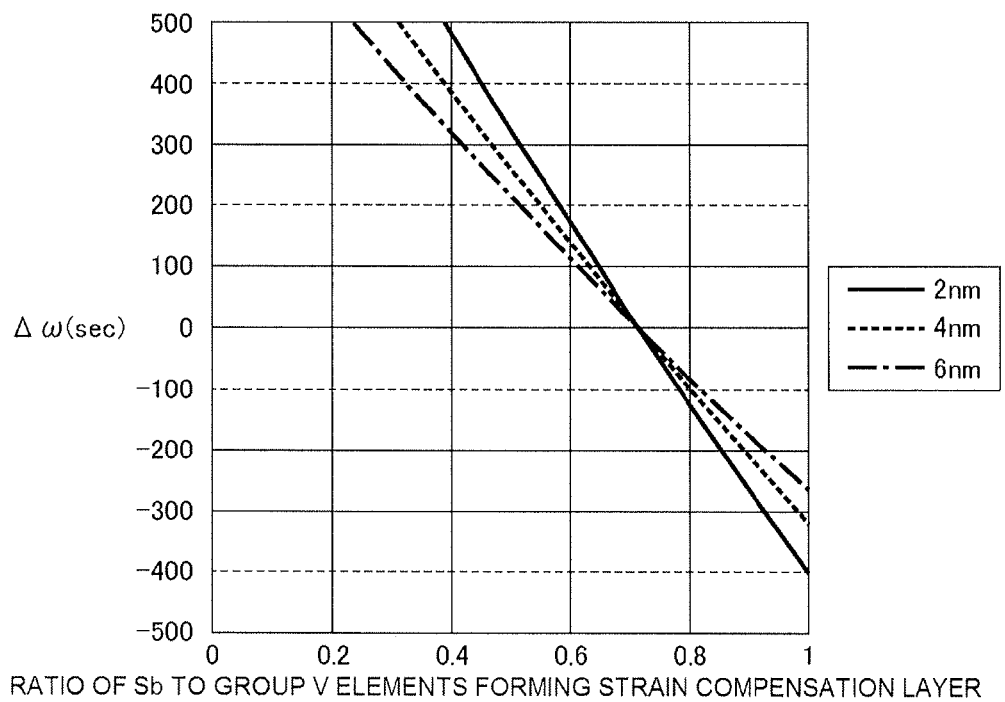
FIG. 16 is a graph illustrating the relationships between the composition of a strain compensation layer and Δω.

Referring to FIGS. 15 and 16, cases of designing an absorption layer for a 12 μm wavelength band will be described. FIGS. 15 and 16 illustrate relationships between the Sb ratio and $\Delta\omega$ in cases where an absorption layer is designed for a 12 μm wavelength band and the first component layer 71 has a thickness of 5 nm and is formed of InAs. FIG. 15 indicates cases corresponding to a single-side compensation-layer type in which a third component layer having a thickness of 0.4 nm is formed as a strain compensation layer. FIG. 16 indicates cases corresponding to a double-side compensation-layer type in which a third component layer having a thickness of 0.4 nm and a fourth component layer having a thickness of 0.4 nm are formed as strain compensation layers. FIG. 15 indicates that, for the single-side compensation-layer type, adjustments of the Sb ratio cannot make $\Delta\omega$ fall within the range of −100 seconds or more and 200 seconds or less. In contrast, referring to FIG. 16, for the double-side compensation-layer type, by setting the Sb ratio to about 0.7, $\Delta\omega$ can be adjusted to a value close to 0. Thus, employment of the double-side compensation-layer type allows formation of an absorption layer for a long cutoff wavelength.

Figure 17:
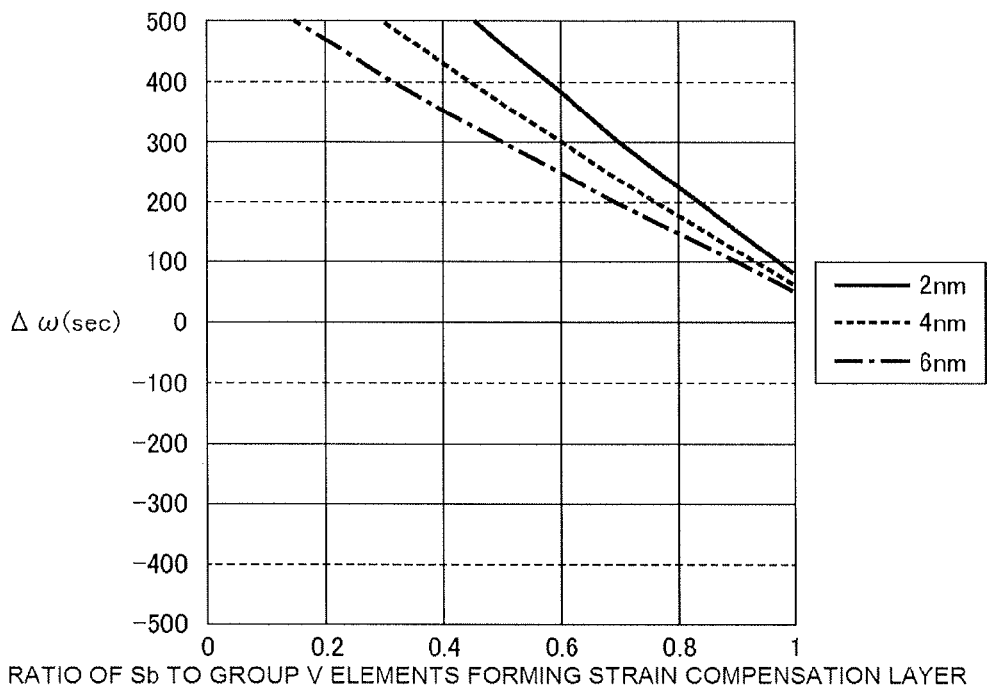
FIG. 17 is a graph illustrating the relationships between the composition of a strain compensation layer and Δω.
Figure 18:
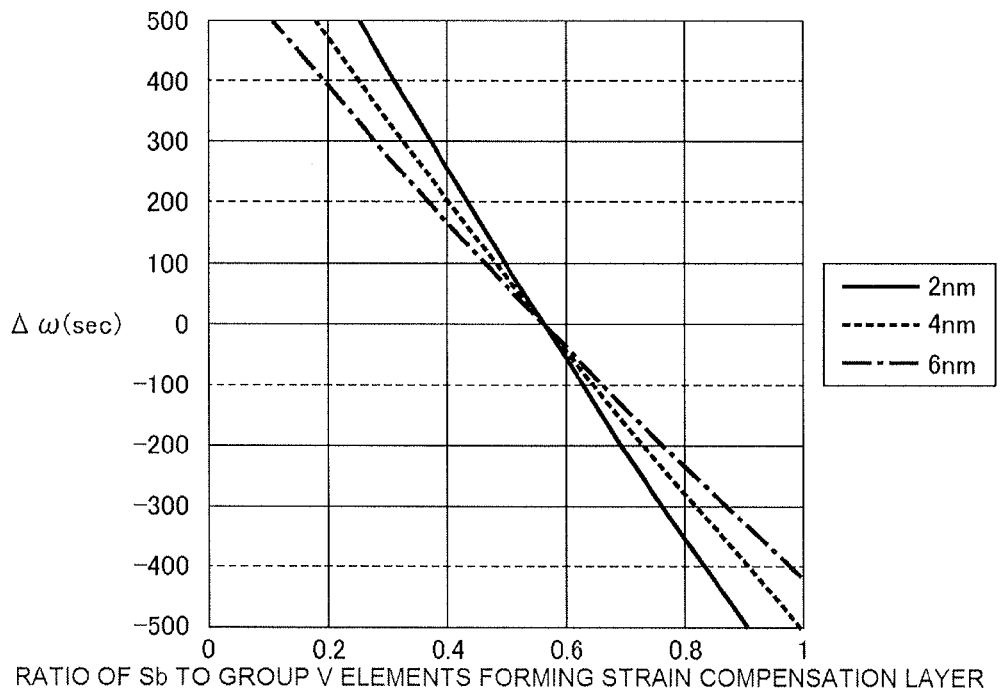
FIG. 18 is a graph illustrating the relationships between the composition of a strain compensation layer and Δω.

Referring to FIGS. 17 and 18, cases of designing an absorption layer for a 12 μm wavelength band will be described. FIGS. 17 and 18 illustrate relationships between the Sb ratio and $\Delta\omega$ in cases where an absorption layer is designed for a 12 μm wavelength band and the first component layer 71 has a thickness of 5 nm and is formed of $InAs_{0.98}Sb_{0.02}$. FIG. 17 indicates cases corresponding to a single-side compensation-layer type in which a third component layer having a thickness of 0.4 nm is formed as a strain compensation layer. FIG. 18 indicates cases corresponding to a double-side compensation-layer type in which a third component layer having a thickness of 0.4 nm and a fourth component layer having a thickness of 0.4 nm are formed as strain compensation layers. That is, the same unit structures 41 as in FIGS. 15 and 16 are employed except that InAs forming the first component layers 71 is doped with Sb. Employment of the first component layers 71 formed of $InAs_{0.98}Sb_{0.02}$ reduces the tensile strain applied to the first component layers 71. As a result, referring to FIG. 17, adjusting $\Delta\omega$ to be in the range of −100 seconds or more and 200 seconds or less, which cannot be achieved in the above-described single-side compensation-layer type in which the first component layer 71 is formed of InAs, can be achieved by setting the Sb ratio to 0.7 or more. Referring to FIG. 18, for the double-side compensation-layer type, $\Delta\omega$ can also be adjusted to be in the range of −100 seconds or more and 200 seconds or less. In this way, by doping InAs forming the first component layer 71 with Sb, the single-side compensation-layer type can also be employed for long cutoff wavelengths.

EXAMPLE 2

The following experiments were carried out: multiple quantum well structures having the same configuration as in the above-described embodiment were actually produced and examined for surface morphology. The procedures of the experiments are as follows.

Figure 9:
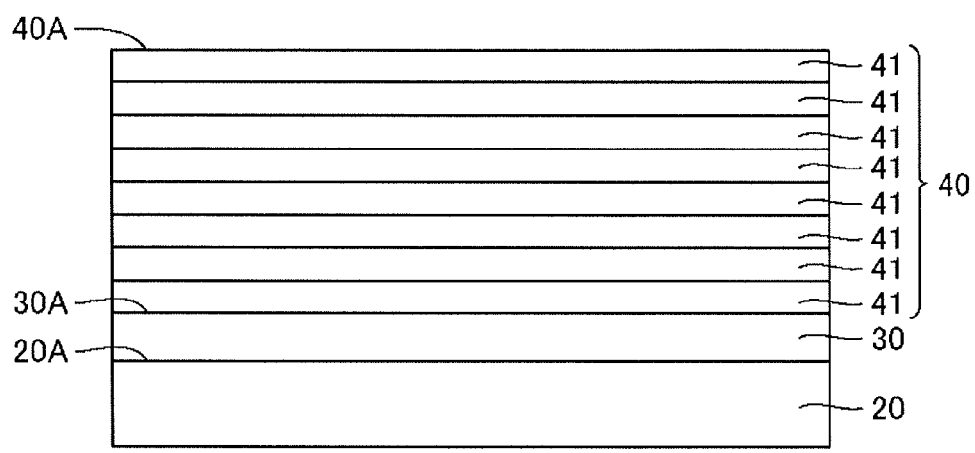
FIG. 9 is a schematic sectional view illustrating an example of a method for producing a photodiode.

Referring to FIG. 9, the buffer layer 30 and the multiple quantum well structure 40 were formed on the substrate 20. The buffer layer 30 had a thickness of 100 nm. The multiple quantum well structure 40 was formed so as to include 100 periods of the unit structure 41. The buffer layer 30 and the multiple quantum well structure 40 were formed by metalorganic vapor phase epitaxy. The buffer layer 30 was grown at a growth temperature of 500° C. The multiple quantum well structure 40 was grown at a growth temperature of 475° C. The substrate 20 was formed of GaSb and had the main surface 20A in the (001) plane. The buffer layer 30 formed of undoped GaSb was formed on the main surface 20A of the substrate 20. After that, 100 periods of the unit structure 41 illustrated in FIG. 2 were formed on the main surface 30A of the buffer layer 30. The design cutoff wavelength was 5.5 μm.

Figure 19:
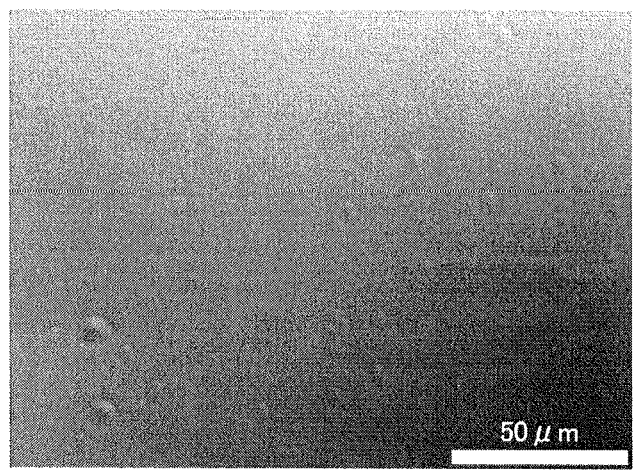
FIG. 19 is a micrograph of the surface of an absorption layer taken with an optical microscope in a case where a third component layer is formed of $InSb_{0.3}As_{0.7}$.
Figure 20:
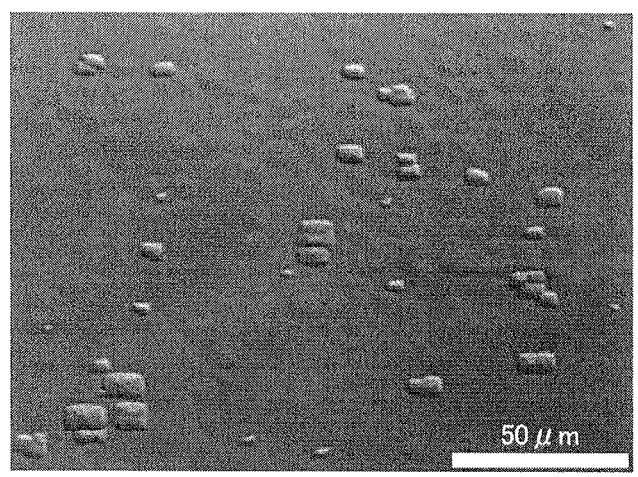
FIG. 20 is a micrograph of the surface of an absorption layer taken with an optical microscope in a case where a third component layer is formed of InSb.

The unit structure 41 was formed so as to include the first component layer 71 having a thickness of 3 nm and formed of InAs, the second component layer 72 having a thickness of 6 nm and formed of GaSb, and the third component layer 73 (strain compensation layer) having a thickness of 0.5 nm and formed of $InSb_{0.3}As_{0.7}$ (Example A). For the purpose of comparison, another multiple quantum well structure was also formed as in Example A except that the third component layer 73 (strain compensation layer) in Example A was changed so as to have a thickness of 0.3 nm and be formed of InSb (Comparative example A). Measurements by X-ray diffractometry gave the following results: $\Delta\omega$ in Example A was found to be 185 seconds; and $\Delta\omega$ in Comparative example A was found to be 57 seconds. The multiple quantum well structures in Example A and Comparative example A were observed for surface morphology with an optical microscope. The observation results in Example A and Comparative example A are respectively illustrated in FIGS. 19 and 20.

$\Delta\omega$ in Example A was larger than $\Delta\omega$ in Comparative example A. That is, the strain is higher in Example A than in Comparative example A. Thus, Example A is in a disadvantageous position in terms of strain, compared with Comparative example A. In spite of that, FIGS. 19 and 20 indicate that Example A is superior to Comparative example A in terms of surface morphology. These results have demonstrated that employment of a strain compensation layer formed of InSb doped with As, that is, employment of a strain compensation layer formed of InSbAs, results in enhancement of surface morphology.

Considering a case where the cutoff wavelength is increased to 6.8 μm, another experiment was carried out by production methods as in Example A and Comparative example A except that the thickness of the first component layer 71 was changed to 3.5 nm. Specifically, the unit structure 41 was formed so as to include the first component layer 71 having a thickness of 3.5 nm and formed of InAs, the second component layer 72 having a thickness of 6 nm and formed of GaSb, and the third component layer 73 (strain compensation layer) having a thickness of 0.5 nm and formed of $InSb_{0.3}As_{0.7}$ (Example B). $\Delta\omega$ in Example B was found to be 321 seconds. From the standpoint of decreasing $\Delta\omega$, another multiple quantum well structure was formed as in Example B except that the thickness of the third component layer 73 in Example B was increased to, more than 0.9 nm, 1 nm (Comparative example B). $\Delta\omega$ in Comparative example B was found to be 182 seconds. The multiple quantum well structures in Example B and Comparative example B were observed for surface morphology with an optical microscope. The observation results in Example B and Comparative example B are respectively illustrated in FIGS. 21 and 22.

Figure 21:
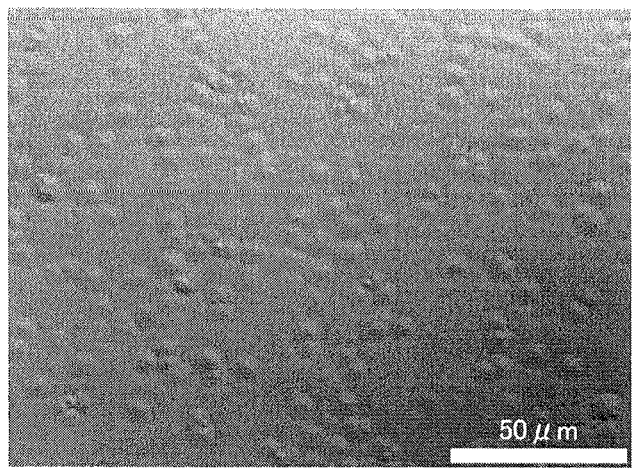
FIG. 21 is a micrograph of the surface of an absorption layer taken with an optical microscope in a case where a third component layer has a thickness of 0.5 nm.
Figure 22:
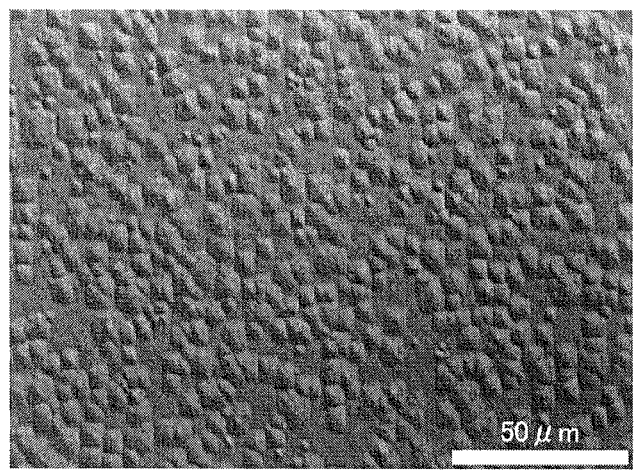
FIG. 22 is a micrograph of the surface of an absorption layer taken with an optical microscope in a case where a third component layer has a thickness of 1 nm.

Referring to FIGS. 21 and 22, the surface morphology in Example B is at an acceptable level, whereas the surface morphology in Comparative example B is so poor that adversely affects device characteristics. Note that $\Delta\omega$ in Comparative example B is smaller than $\Delta\omega$ in Example B. In other words, the strain is lower in Comparative example B than in Example B. Thus, from the standpoint of strain, Comparative example B is in an advantageous position, compared with Example B. In spite of that, in Comparative example B employing the third component layer 73 having a thickness of more than 0.9 nm, the surface morphology is poor and at an unacceptable level. These results indicate that the strain compensation layer formed of InSbAs needs be formed so as to have a thickness of 0.9 nm or less.

Another multiple quantum well structure was formed as in Example B except that another strain compensation layer was additionally formed between the first component layer 71 and the second component layer 72 (Example C). That is, a strain compensation layer was additionally formed in the configuration of Example B in FIG. 2 to provide the configuration in FIG. 4. Specifically, referring to FIG. 4, the unit structure 41 was formed so as to include the first component layer 71 formed of InAs and having a thickness of 3.5 nm, the third component layer 73 (strain compensation layer) formed of $InSb_{0.3}As_{0.7}$ and having a thickness of 0.4 nm, the second component layer 72 formed of GaSb and having a thickness of 6 nm, and the fourth component layer 74 (strain compensation layer) formed of $InSb_{0.3}As_{0.7}$ and having a thickness of 0.5 nm. In Example C, $\Delta\omega$ was found to be −66 seconds. The surface morphology of the multiple quantum well structure in Example C was observed with an optical microscope. The observation result is illustrated in FIG. 23.

Figure 23:
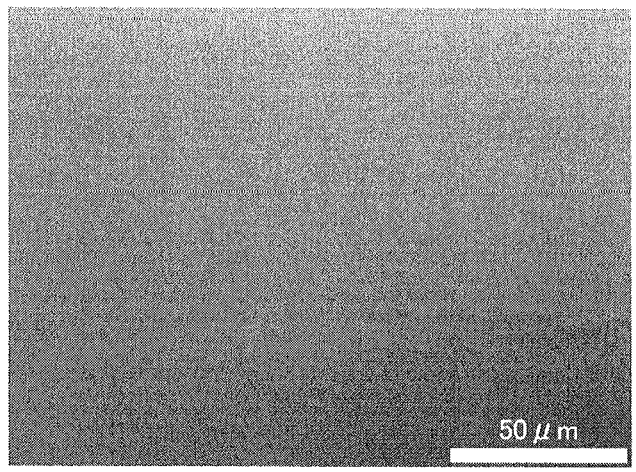
FIG. 23 is a micrograph of the surface of an absorption layer taken with an optical microscope in a case where a fourth component layer is further formed.

Referring to FIG. 23, the surface morphology in Example C is very good. Comparison among Example B, Example C, and Comparative example B in terms of surface morphology indicates the following. In order to reduce strain in a multiple quantum well structure, forming the third component layer 73 so as to have a thickness of a predetermined value or more, that is, 0.9 nm or more in the unit structure in FIG. 2 is inferior to employing the fourth component layer to provide the unit structure in FIG. 4 (unit structure in which strain compensation layers are disposed on both main surfaces of the second component layer 72); Example C has demonstrated that this unit structure in FIG. 4 allows reduction in strain while maintaining better surface morphology.

The embodiments and Examples disclosed herein are mere examples in all respects and should be understood as being non-limitative in any perspective. The scope of the present invention is defined not by the above-described description but by Claims. The scope of the present invention is intended to embrace all the modifications within the meaning and range of equivalency of the Claims.

In particular, semiconductor devices according to embodiments of the present invention can be advantageously applied to semiconductor devices including an absorption layer having a multiple quantum well structure.

What is claimed is:

1. A semiconductor device comprising:
a substrate formed of a III-V compound semiconductor;
a buffer layer disposed on the substrate and formed of GaSb; and
an absorption layer formed on the buffer layer and including a multiple quantum well structure formed of III-V compound semiconductors,
wherein the multiple quantum well structure includes a stack of unit structures each including a plurality of component layers,
each of the unit structures includes
a first component layer formed of $InAs_{1-a}Sb_a$
a second component layer formed of GaSb, and
a third component layer formed of $InSb_xAs_{1-x}$
in one unit structure among the unit structures, the third component layer is disposed so as to be in contact with one of main surfaces of the second component layer, another one of the main surfaces of the second component layer is in contact with the first component layer present within the one unit structure or within another unit structure disposed on the one unit structure, the ratio a in $InAs_{1-a}Sb_a$ forming the first component layer is 0 or more and 0.05 or less, the ratio x in $InSb_xAs_{1-x}$ forming the third component layer is more than 0 and less than 1, and the third component layer has a thickness of 0.1 nm or more and 0.9 nm or less.

2. A semiconductor device comprising:

a substrate formed of a III-V compound semiconductor;

a buffer layer disposed on the substrate and formed of GaSb; and an absorption layer formed on the buffer layer and including a multiple quantum well structure formed of III-V compound semiconductors, wherein the multiple quantum well structure includes a stack of unit structures each including a plurality of component layers, each of the unit structures includes a first component layer formed of $InAs_{1-a}Sb_a$ a second component layer formed of GaSb, a third component layer formed of $InSb_xAs_{1-x}$, and a fourth component layer formed of $InSb_yAs_{1-y}$ in the unit structure, the third component layer is disposed so as to be in contact with one of main surfaces of the second component layer, the fourth component layer is disposed so as to be in contact with another one of the main surfaces of the second component layer, the ratio a in $InAs_{1-a}Sb_a$ forming the first component layer is 0 or more and 0.05 or less, the ratio x in $InSb_xAs_{1-x}$ forming the third component layer is more than 0 and less than 1, the ratio y in $InSb_yAs_{1-y}$ forming the fourth component layer is 0.3 or more and less than 1, the third component layer has a thickness of 0.1 nm or more and 0.9 nm or less, and the fourth component layer has a thickness of 0.1 nm or more and 0.9 nm or less.

3. The semiconductor device according to claim 1, wherein the ratio x in $InSb_xAs_{1-x}$ forming the third component layer is 0.3 or more.

4. The semiconductor device according to claim 1, wherein each of the unit structures further includes a fifth component layer formed of $InSb_zAs_{1-z}$, the fifth component layer is disposed within the first component layer or within the second component layer, the ratio z in $InSb_zAs_{1-z}$ forming the fifth component layer is more than 0 and less than 1, and the fifth component layer has a thickness of 0.1 nm or more and 0.9 nm or less.

5. The semiconductor device according to claim 4, wherein the ratio z in $InSb_zAs_{1-z}$ forming the fifth component layer is 0.3 or more.

6. The semiconductor device according to claim 1, wherein $\Delta\omega$, which is a difference in $\omega$ component between a zero-order satellite peak among X-ray (004) diffraction peaks of the III-V compound semiconductors forming the multiple quantum well structure and an X-ray (004) diffraction peak of GaSb forming the buffer layer, is −400 seconds or more and 400 seconds or less.

7. The semiconductor device according to claim 6, wherein the $\Delta\omega$ is −100 seconds or more and 200 seconds or less.

8. The semiconductor device according to claim 1, wherein the ratio a in $InAs_{1-a}Sb_a$ forming the first component layer is 0.005 or more.

9. The semiconductor device according to claim 1, wherein the ratio a in $InAs_{1-a}Sb_a$ forming the first component layer is 0.

10. The semiconductor device according to claim 1, wherein the substrate is formed of GaSb.

11. The semiconductor device according to claim 1, wherein the second component layer has a thickness of 4 nm or more and 7 nm or less.

12. The semiconductor device according to claim 1, wherein the III-V compound semiconductors forming the multiple quantum well structure have a carbon concentration of $1\times10^{16}$ $cm^{-3}$ or less.

13. The semiconductor device according to claim 1, wherein the multiple quantum well structure is formed by metal-organic vapor phase epitaxy.

* * * * *